(12) United States Patent
Bahramian

(10) Patent No.: US 8,659,275 B2
(45) Date of Patent: Feb. 25, 2014

(54) HIGHLY EFFICIENT III-NITRIDE POWER CONVERSION CIRCUIT

(75) Inventor: Tony Bahramian, Torrance, CA (US)

(73) Assignee: International Rectifier Corporation, El Segundo, CA (US)

(*) Notice: Subject to any disclaimer, the term of this patent is extended or adjusted under 35 U.S.C. 154(b) by 521 days.

(21) Appl. No.: 13/043,235

(22) Filed: Mar. 8, 2011

(65) Prior Publication Data

US 2011/0157949 A1   Jun. 30, 2011

Related U.S. Application Data

(63) Continuation-in-part of application No. 12/008,629, filed on Jan. 11, 2008, now Pat. No. 8,063,616.

(51) Int. Cl.
*H02M 1/08* (2006.01)

(52) U.S. Cl.
USPC ............................ 323/271; 323/312

(58) Field of Classification Search
USPC .......... 323/269–272, 312–314; 327/538–543; 326/62
See application file for complete search history.

(56) References Cited

U.S. PATENT DOCUMENTS

| | | | |
|---|---|---|---|
| 4,704,563 A | 11/1987 | Hussey | |
| 5,649,466 A | 7/1997 | Genovese | |
| 6,768,354 B2* | 7/2004 | Yamazaki et al. | 327/143 |
| 7,116,136 B2 | 10/2006 | Honda | |
| 7,382,001 B2 | 6/2008 | Beach | |
| 7,427,877 B2* | 9/2008 | Komai | 326/68 |
| 8,063,616 B2* | 11/2011 | Bahramian et al. | 323/271 |
| 2005/0189562 A1 | 9/2005 | Kinzer | |
| 2006/0060871 A1 | 3/2006 | Beach | |
| 2006/0113593 A1 | 6/2006 | Sankin | |
| 2006/0279351 A1 | 12/2006 | Salato | |
| 2009/0180304 A1 | 7/2009 | Bahramian | |
| 2011/0025397 A1 | 2/2011 | Wang | |

FOREIGN PATENT DOCUMENTS

| | | |
|---|---|---|
| JP | 4-233824 | 8/1992 |
| JP | 2007-6658 | 1/2007 |

OTHER PUBLICATIONS

International Search Report issued Jul. 18, 2008 in corresponding PCT Application No. PCT/US08/001133.

* cited by examiner

*Primary Examiner* — Jessica Han
(74) *Attorney, Agent, or Firm* — Farjami & Farjami LLP

(57) ABSTRACT

According to an exemplary embodiment, a III-nitride power conversion circuit includes a gate driver having a plurality of cascaded inverters, each of the plurality of cascaded inverters including at least one III-nitride transistor. At least one of the plurality of cascaded inverters has a cutoff switch and a III-nitride depletion mode load where the cutoff switch is configured to disconnect the III-nitride depletion mode load so as to prevent current from flowing from a supply voltage of the at least one of the plurality of cascaded inverters. The cutoff switch of the at least one of the plurality of cascaded inverters can be driven by one of the plurality of cascaded inverters. The III-nitride power conversion circuit can also include an output driver driven by the gate driver where the output driver has a segmented III-nitride transistor. Furthermore, a selector circuit can be configured to selectively disable at least one segment of the segmented III-nitride transistor.

20 Claims, 4 Drawing Sheets

US 8,659,275 B2

HIGHLY EFFICIENT III-NITRIDE POWER CONVERSION CIRCUIT

The present application is a continuation-in-part of, and claims the benefit of and priority to a pending parent patent application entitled "Integrated III-Nitride Power Converter Circuit," Ser. No. 12/008,629, filed on Jan. 11, 2008 now U.S. Pat. No. 8,063,616. The disclosure in that pending parent application is hereby incorporated fully by reference into the present application.

DEFINITION

In the present application, "III-nitride" refers to a compound semiconductor that includes nitrogen and at least one group III element, such as, but not limited to, GaN, AlGaN, InN, AlN, InGaN, InAlGaN and the like.

BACKGROUND OF THE INVENTION

1. Field of the Invention

The present invention is generally in the field of power conversion circuits. More particularly, the invention relates to power conversion circuits using III-nitride transistors.

2. Background Art

Conventionally, silicon metal-oxide-semiconductor field-effect transistors (MOSFETs) have been used extensively as switches in the design and implementation of power conversion circuits. As examples, silicon MOSFETs may be utilized for a gate driver and output drivers of the power conversion circuit to convert power with high efficiency. The silicon-based power conversion circuit can employ both P channel metal-oxide semiconductor (PMOS) and N channel metal-oxide semiconductor (NMOS) transistors to form a highly efficient circuit. For example, complementary metal-oxide-semiconductor (CMOS) technology can be utilized where significant power may only be consumed while transistors are switching between ON and OFF.

III-nitride transistors can have enhanced performance characteristics relative to similar silicon MOSFETs, which can make III-nitride transistors particularly desirable for power applications. For example, III-nitride transistors, such as III-nitride high electron mobility transistors (HEMTs), can have relatively low resistivity during conduction, high frequency switching capability, high current carrying capability, and high breakdown voltage. However, III-nitride transistor technology has no close analogue to the PMOS transistor in silicon technology. As such, when implementing III-nitride transistor in a power conversion circuit, it can be challenging to provide a highly efficient circuit, such as a highly efficient gate driver, for the power conversion circuit.

Thus, there is a need in the art for the capability to provide a highly efficient III-nitride power conversion circuit while overcoming the drawbacks and deficiencies in the art.

SUMMARY OF THE INVENTION

A highly efficient III-nitride power conversion circuit, substantially as shown in and/or described in connection with at least one of the figures, and as set forth more completely in the claims.

DETAILED DESCRIPTION OF THE INVENTION

The present invention is directed to a highly efficient III-nitride power conversion circuit. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
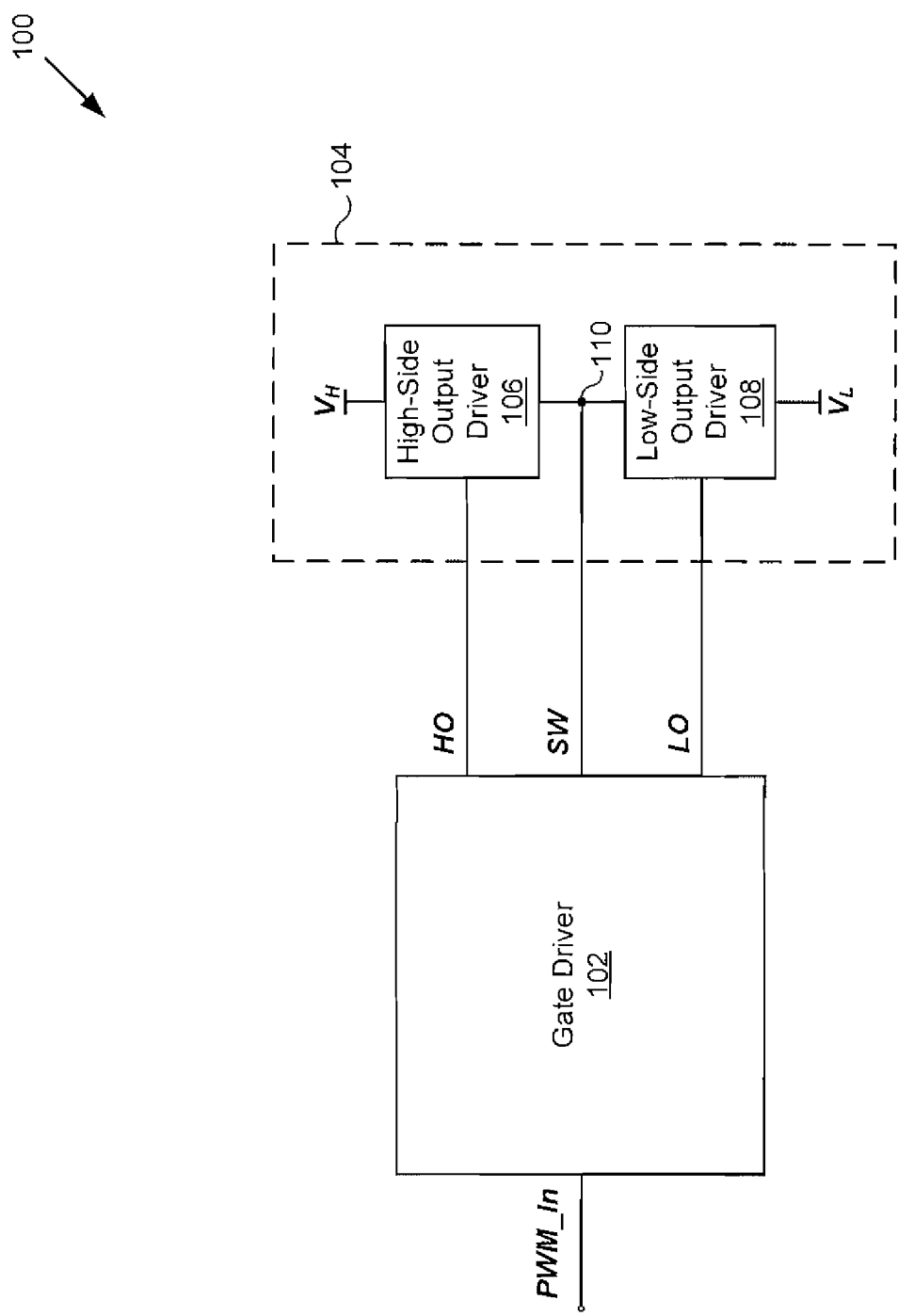
FIG. 1 illustrates an exemplary III-nitride power conversion circuit, according to one embodiment of the invention.

FIG. 1 illustrates an exemplary III-nitride power conversion circuit, according to one embodiment of the invention. As shown in FIG. 1, III-nitride power conversion circuit 100 includes gate driver 102 and output stage 104. Output stage 104 includes high-side output driver 106, low-side output driver 108, and output node 110. In output stage 104, high-side output driver 106 and low-side output driver 108 are connected between high-side voltage $V_H$ and low-side voltage $V_L$ and output node 110 is between high-side output driver 106 and low-side output driver 108.

In the present embodiment, power conversion circuit 100 can be a buck converter, such as a synchronous buck converter, having pulse width modulated (PWM) signal PWM_In as an input and switching voltage SW as an output. In power conversion circuit 100, gate driver 102 includes PWM signal PWM_In and switching voltage SW as inputs and high-side drive signal HO and low-side drive signal LO, which are gate drive signals, as outputs. In some embodiments, gate driver 102 may not include switching voltage SW as an input. Output stage 104 includes high-side drive signal HO and low-side drive signal LO as inputs and switching voltage SW as an output.

Gate driver 102 can receive PWM signal PWM_In to drive high-side output driver 106 and low-side output driver 108. For example, gate driver 102 is configured to generate high-side drive signal HO and low-side drive signal LO based on PWM signal PWM_In to drive respective high-side and low-side output drivers 106 and 108 using synchronous rectification. It is noted that power conversion circuit 100 is merely exemplary and various aspects of the present invention can be implemented using other approaches to power conversion including other power conversion circuit topologies.

In one embodiment, high-side output driver 106 is a III-nitride transistor and low-side output driver 108 is a III-nitride transistor. For example, high-side output driver 106 can be a III-nitride transistor connected between high-side voltage $V_H$ and output node 110 where the gate of the III-nitride transistor is connected to high-side drive signal HO. Similarly, low-side output driver 108 can be a III-nitride transistor connected between output node 110 and low-side voltage $V_L$ where the gate of the III-nitride transistor is connected to low-side drive signal LO. In some embodiments high-side output driver 106 and low-side output driver 108 can each comprise depletion mode III-nitride transistors. In the present embodiment, high-side and low-side output drivers 106 and 108 each comprise depletion mode III-nitride high electron mobility transistors (HEMTs), and more particularly depletion mode gallium arsenide (GaN) HEMTs.

As described above, in the present embodiment, high-side and low-side output drivers 106 and 108 comprise GaN HEMTs. Also in the present embodiment, gate driver 102 comprises GaN HEMTs, which are utilized to generate high-side and low-side drive signals HO and LO based on PWM signal PWM_In. Thus, power conversion circuit 100 can have high frequency switching capability and high current carrying capability by utilizing GaN HEMTs in both gate driver 102 and output stage 104. In some embodiments, gate driver 102 and high-side and low-side output drivers 106 and 108 can be monolithically formed over a common substrate.

Conventionally, a gate driver and high-side and low-side output drivers can comprise silicon transistors and can employ both P channel metal-oxide semiconductor (PMOS) and N channel metal-oxide semiconductor (NMOS) transistors to form an efficient circuit. For example, complementary metal-oxide-semiconductor (CMOS) technology can be utilized where significant power may only be consumed while transistors are switching between ON and OFF. However, in the present embodiment power conversion circuit 100 comprises III-nitride transistors, and more particularly GaN HEMTs, which have no close analogue to the PMOS transistor. Thus, in the present embodiment, power conversion circuit 100 cannot benefit from the efficiency advantages offered by utilizing both PMOS and NMOS transistors in gate driver 102.

In accordance with various embodiments of the present invention, in order to provide for efficient power conversion, one or both of high-side and low-side output drivers 106 and 108 can comprise a segmented III-nitride transistor. Also, output stage 104 can include at least one selector circuit, for example a multiplexer, configured to selectively disable at least one segment of the segmented III-nitride transistor, as will be described in more detail with respect to FIG. 4. By selectively disabling at least one segment of the segmented III-nitride transistor, power conversion circuit 100 can have improved efficiency. Furthermore, in accordance with various embodiments of the present invention, gate driver 102 comprises a plurality of cascaded inverters where at least one of the plurality of cascaded inverters has a cutoff switch and a III-nitride depletion mode load. The cutoff switch is configured to disconnect the III-nitride depletion mode load so as to prevent current from flowing from a supply voltage of the at least one of the plurality of cascaded inverters. According to the present invention, the cutoff switch can be included in at least one power-efficient pre-driver, which will be described in more detail with respect to FIGS. 2 and 3.

Figure 2:
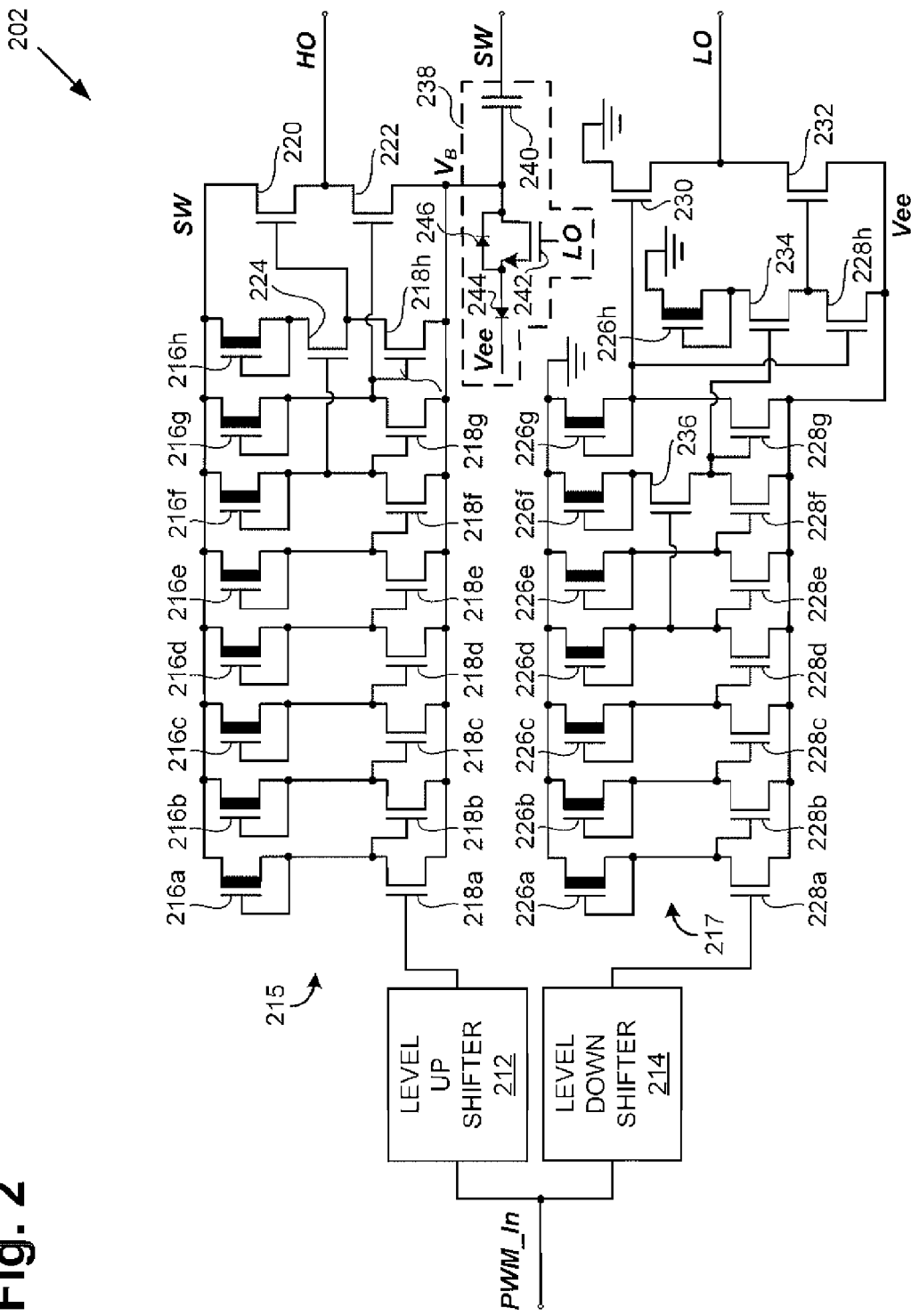
FIG. 2 illustrates an exemplary gate driver, according to one embodiment of the invention.

Referring now to FIG. 2, FIG. 2 illustrates an exemplary gate driver, according to one embodiment of the invention. FIG. 2 shows gate driver 202, which can correspond with gate driver 102 in FIG. 1. As such, gate driver 202 includes PWM signal PWM_In and switching voltage SW as inputs and high-side drive signal HO and low-side drive signal LO as outputs.

Gate driver 202 includes level up shifter 212, III-nitride depletion mode loads 216a, 216b, 216c, 216f, 216e, 216f, 216g, and 216h, which in the present application may also be referred to collectively as "III-nitride depletion mode loads 216," input transistors 218a, 218b, 218c, 218f, 218e, 218f, 218g, and 218h, which in the present application may also be referred to collectively as "input transistors 218," high-side output transistors 220 and 222, cutoff switch 224, and bootstrap circuit 238 for generating high-side drive signal HO based on PWM signal PWM_In.

Gate driver 202 also includes level down shifter 214, III-nitride depletion mode loads 226a, 226b, 226c, 226f, 226e, 226f, 226g, and 226h, which in the present application may also be referred to collectively as "III-nitride depletion mode loads 226," input transistors 228a, 228b, 228c, 228f, 228e, 228f, 228g, and 228h, which in the present application may also be referred to collectively as "input transistors 228," low-side output transistors 230 and 232, and cutoff switches 234 and 236 for generating low-side drive signal LO based on PWM signal PWM_In.

Thus, gate driver 202 has plurality of cascaded inverters 215 and plurality of cascaded inverters 217. In FIG. 2, each of plurality of cascaded inverters 215 includes a respective III-nitride depletion mode load 216 and a respective input transistor 218. In the present embodiment, input transistors 218 are III-nitride enhancement mode transistors. Plurality of cascaded inverters 215 are coupled across switching voltage SW and bootstrap voltage $V_B$, which each comprise supply voltages of plurality of cascaded inverters 215.

Gate driver 202 includes bootstrap circuit 238 for generating bootstrap voltage $V_B$. Bootstrap circuit 238 is connected between negative supply voltage Vee and switching voltage SW. Bootstrap circuit 238 includes bootstrap capacitor 240, bootstrap transistor 242, and diodes 244 and 246. In bootstrap circuit 238, III-nitride bootstrap transistor 242 can be configured to turn ON and OFF together with low-side output driver 108 in FIG. 1 to charge up bootstrap capacitor 240 whenever switching voltage SW is low so as to provide bootstrap voltage $V_B$. In the present application, bootstrap circuit 238 is not intended to limit the present invention. For example, plurality of cascaded inverters 215 can comprise supply voltages using other means.

Also in gate driver 202, each of plurality of cascaded inverters 217 includes a respective III-nitride depletion mode load 226 and a respective input transistor 228. In the present embodiment, input transistors 228 are III-nitride enhancement mode transistors. Plurality of cascaded inverters 217 is coupled across ground and negative voltage Vee, which comprise supply voltages of plurality of cascaded inverters 217.

In operation, when PWM signal PWM_In is high, high-side driver signal HO is supplied to high-side output driver 106 such that high-side output driver 106 is ON. More particularly, in the present embodiment, bootstrap capacitor 240 shifts bootstrap voltage $V_B$ to a voltage below switching voltage SW. PWM signal PWM_In is high, which turns input transistor 218a ON. Thus, a negative voltage is applied to the gate of input switch 218b and input switch 218b is OFF. As III-nitride depletion mode loads 216 are always ON, switching voltage SW is applied to the gate of input transistor 218c. Switching voltage SW is greater than or equal to zero, such that input transistor 218c is ON. In similar fashion, input transistors 218d, 218f, and 218h are OFF and input transistors 218e and 218g are ON. As input transistor 218g is ON, a negative voltage is applied to the gate of high-side output transistor 222 and high-side output transistor 222 is OFF because it is enhancement mode in the present embodiment. Furthermore, as input transistor 218h is OFF, a negative voltage is not applied to the gate of high-side output transistor 220 and high-side output transistor 220 is ON because it is enhancement mode in the present embodiment. Thus, switching voltage SW is applied to high-side output driver 106, which is ON because in the present embodiment high-side output driver 106 is depletion mode and switching voltage SW will not be below the threshold voltage of high-side output driver 106.

Furthermore, when PWM signal PWM_In is high, low-side driver signal LO is supplied to low-side output driver 108 such that low-side output driver 108 is OFF. More particularly, PWM signal PWM_In is high, which turns input transistor 228a ON. Thus, negative supply voltage Vee is applied to the gate of input switch 228b and input switch 228b is OFF. As III-nitride depletion mode loads 226 are always ON, a ground voltage is applied to the gate of input transistor 228c, such that input transistor 228c is ON. In similar fashion, input transistors 228d, 228f, and 228h are OFF and input transistors 228e and 228g are ON. As input transistor 228g is ON, negative supply voltage Vee is applied to the gate of low-side output transistor 230 and low-side output transistor 230 is OFF because it is enhancement mode in the present embodiment. Furthermore, as input transistor 228h is OFF, negative supply voltage Vee is not applied to the gate of low-side output transistor 232 and low-side output transistor 232 is ON because it is enhancement mode in the present embodiment. Thus, negative supply voltage Vee is applied to low-side output driver 108, which is OFF because in the present embodiment low-side output driver 108 is depletion mode and negative supply voltage Vee is below the threshold voltage of high-side output driver 106.

When PWM signal PWM_In is low, high-side driver signal HO is supplied to high-side output driver 106 such that high-side output driver 106 is OFF. More particularly, in the present embodiment, bootstrap transistor 242 is ON, such that bootstrap voltage $V_B$ is connected to negative supply voltage Vee. Input transistors 218a, 218c, 218e, and 218g are OFF and input transistors 218b, 218d, 218f, and 218h are ON. As input transistor 218g is OFF, negative supply voltage Vee is not applied to the gate of high-side output transistor 222 and high-side output transistor 222 is ON because it is enhancement mode in the present embodiment. Furthermore, as input transistor 218h is ON, negative supply voltage Vee is applied to the gate of high-side output transistor 220 and high-side output transistor 220 is OFF because it is enhancement mode in the present embodiment. Thus, negative supply voltage Vee is applied to high-side output driver 106, which is OFF because in the present embodiment high-side output driver 106 is depletion mode.

Also when PWM signal PWM_In is low, low-side driver signal LO is supplied to low-side output driver 108 such that low-side output driver 108 is ON. More particularly, in the present embodiment, input transistors 228a, 228c, 228e, and 228g are OFF and input transistors 228b, 228d, 228f, and 228h are ON. As input transistor 228g is OFF, a ground voltage is applied to the gate of low-side output transistor 230 and low-side output transistor 230 is ON because it is enhancement mode in the present embodiment. Furthermore, as input transistor 228h is ON, negative supply voltage Vee is applied to the gate of low-side output transistor 232 and low-side output transistor 232 is OFF because it is enhancement mode in the present embodiment. Thus, the ground voltage is applied to low-side output driver 108, which is ON because in the present embodiment low-side output driver 108 is depletion mode.

In gate driver 202, plurality of cascaded inverters 215 and plurality of cascaded inverters 217 each include at least one III-nitride transistor. For example, III-nitride depletion mode loads 216 and 226 and input transistors 218 and 228 can each be III-nitride transistors. In the present embodiment, each of III-nitride depletion mode loads 216 and 226 and input transistors 218 and 228 comprise GaN HEMTs. By utilizing, III-nitride transistors, gate driver 202 can provide high frequency switching capability and high current carrying capability. However, III-nitride transistors have no close analogue to the PMOS transistor. Thus, in the present embodiment, gate driver 202 cannot take advantage of efficiency advantages offered by utilizing both PMOS and NMOS transistors.

As described above, III-nitride depletion mode loads 216 and 226 are always ON. Also as described above, during operation of gate driver 202, at least some of input transistors 218 and 228 will be on at the same time as III-nitride depletion mode loads 216 and 226. For example, in the specific example described above, when high-side output driver 106 is OFF, input transistors 218b, 218d, 218f, and 218h are ON. As at least some of input transistors 218 and 228 will be on at the same time as III-nitride depletion mode loads 216 and 226, power efficiency can suffer in gate driver 202. For example, when III-nitride depletion mode load 216b and input transistor 218b are both ON, current can flow between bootstrap voltage $V_B$ and switching voltage SW, thereby reducing power efficiency of gate driver 202.

In accordance with various embodiments of the present invention, in order to improve efficiency, at least one of the inverters in gate driver 202 has a cutoff switch configured to disconnect a III-nitride depletion mode load so as to prevent current from flowing from a supply voltage of the inverter. In the present embodiment, the inverter is implemented in a power-efficient pre-driver. In the present embodiment, one power-efficient pre-driver comprises III-nitride depletion mode loads 216f, 216g, and 216h, input transistors 218f, 218g, and 218h and cutoff switch 224. Also in the present embodiment, another power-efficient pre-driver comprises III-nitride depletion mode loads 226f, 226g, and 226h, input transistors 228f, 228g, and 228h and cutoff switches 234 and 236.

Cutoff switch 224, which in one embodiment is a III-nitride enhancement mode transistor, is configured to disconnect III-nitride depletion mode load 216h so as to prevent current from flowing from switching voltage SW. More particularly, cutoff switch 224 is configured to disconnect III-nitride depletion mode load 216h so as to prevent current from flowing between switching voltage SW and bootstrap voltage $V_B$ when input transistor 218h is ON. Cutoff switch 234 is configured to disconnect III-nitride depletion mode load 226h so as to prevent current from flowing from ground. More particularly, cutoff switch 234 is configured to disconnect III-nitride depletion mode load 226h so as to prevent current from flowing between ground and negative supply voltage Vee when input transistor 228h is ON. Also, cutoff switch 236 is configured to disconnect III-nitride depletion mode load 226f so as to prevent current from flowing from ground. More particularly, cutoff switch 236 is configured to disconnect III-nitride depletion mode load 226f so as to prevent current from flowing between ground and negative supply voltage Vee when input transistor 228f is ON. Thus, cutoff switches 224, 234, and 236 can improve efficiency in gate driver 202.

It is noted that while only one of plurality of cascaded inverters 215 includes a cutoff switch and two of plurality of cascaded inverters 217 include a cutoff switch. However, in various embodiments, any combination of the inverters in plurality of cascaded inverters 215 and 217 can include a cutoff switch. Furthermore, although in the present embodiment plurality of cascaded inverters 215 and 217 each include eight inverters, gate driver 202 can include more or fewer inverters in other embodiments of the present invention. Also, in the present embodiment, cutoff switches 224, 234, and 236, input transistors 218 and 228, III-nitride depletion mode loads 216 and 226, high-side output transistors 220 and 222 and low-side output transistors 230 and 232 are each III-nitride transistors, and more particularly GaN HEMTs. Thus, gate driver 202 can have high frequency switching capability and high current carrying capability.

In gate driver 202, plurality of cascaded inverters 215 is configured to amplify a signal from level up shifter 212. For example, in the present embodiment, plurality of cascaded inverters 215 receives a high-side signal as an input signal at the gate of input transistor 218a to generate amplified high-side driver signal HO. Thus, for example, the inverter including III-nitride depletion mode load 216h and input transistor 218h is configured to supply a higher current from switching voltage SW to the gate of high-side output transistor 220 than the current the inverter including III-nitride depletion mode load 216a and input transistor 218a is configured to supply from switching voltage SW to the gate of input transistor 218b. As such, cutoff switch 224 is most effective when included near the output of plurality of cascaded inverters 215, as shown in FIG. 2. Similarly, plurality of cascaded inverters 217 is configured to amplify a signal from level down shifter 214. For example, in the present embodiment, plurality of cascaded inverters 217 receives a low-side signal as an input signal at the gate of input transistor 228a to generate amplified low-side driver signal LO. It is noted that some embodiments of the present invention may not include at least one of level down shifter 214 and level up shifter 212.

Figure 3:
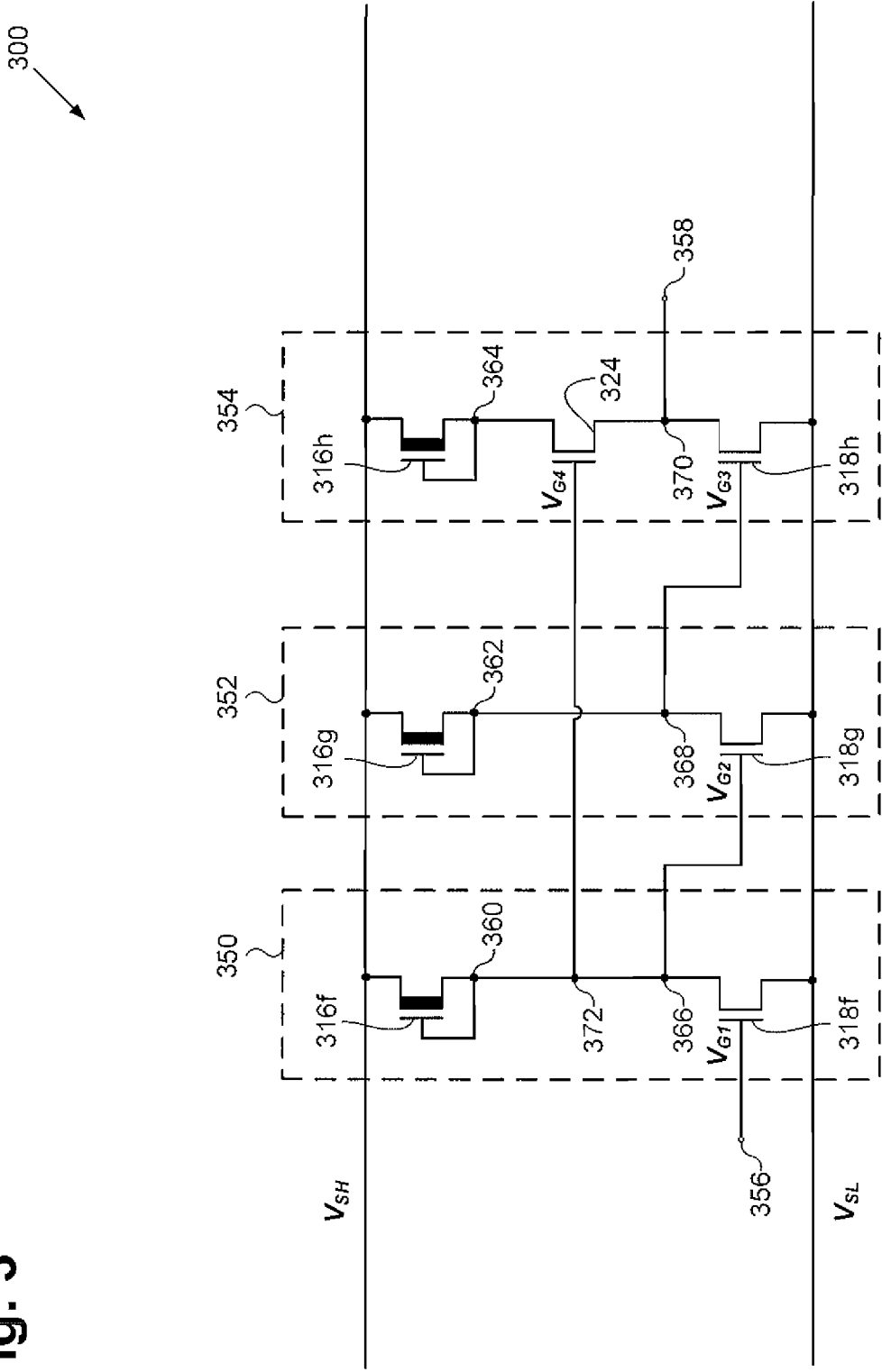
FIG. 3 illustrates an exemplary power-efficient pre-driver, according to one embodiment of the invention.

Referring now to FIG. 3, FIG. 3 illustrates an exemplary power-efficient pre-driver, according to one embodiment of the invention. More particularly, FIG. 3 shows power-efficient pre-driver 300 having inverters 350, 352, and 354, input node 356 and output node 358. Power-efficient pre-driver 300 also includes high supply voltage $V_{SH}$ and low supply voltage $V_{SL}$, corresponding respectively to switching voltage SW and bootstrap voltage $V_B$ in FIG. 2.

Inverter 350 includes III-nitride depletion mode load 316f and input transistor 318f corresponding respectively to III-nitride depletion mode load 216f and input transistor 218f in FIG. 2. Similarly, inverter 352 includes III-nitride depletion mode load 316g and input transistor 318g corresponding respectively to III-nitride depletion mode load 216g and input transistor 218g in FIG. 2. Also, inverter 354 includes III-nitride depletion mode load 316h, input transistor 318h, and cutoff switch 324 corresponding respectively to III-nitride depletion mode load 216h, input transistor 218h, and cutoff switch 224 in FIG. 2.

As shown in FIG. 3, the gate of each of III-nitride depletion mode loads 316f, 316g, and 316h are coupled to respective source nodes 360, 362, and 364. Thus, III-nitride depletion mode loads 316f, 316g, and 316h are always ON.

In power-efficient pre-driver 300, input node 356 is configured to supply gate voltage $V_{G1}$ to input transistor 318f. Also in power-efficient pre-driver 300, shared node 366 comprises an output node of inverter 350 and an input node of inverter 352. More particularly, shared node 366 is configured to supply gate voltage $V_{G2}$ to input transistor 318g. Similarly, shared node 368 comprises an output node of inverter 352 and an input node of inverter 354. More particularly, shared node 368 is configured to supply gate voltage $V_{G3}$ to input transistor 318h. Thus, inverter 350 is configured to drive inverter 352 and inverter 352 is configured to drive inverter 354. Furthermore, in power-efficient pre-driver 300, output node 370 of inverter 354 is configured to supply an output voltage to output node 358 of power-efficient pre-driver 300.

Also shown in FIG. 3, shared node 372 comprises an output node of inverter 350 and an input node of inverter 354. More particularly, shared node 372 is configured to supply gate voltage $V_{G4}$ to cutoff switch 324. When input node 356 is at, for example, a negative voltage, input transistor 218f is OFF. Thus, shared node 372 is pulled to high voltage $V_H$, thereby pulling gate voltage $V_{G4}$ to high voltage $V_H$ and cutoff switch 324 is ON. As such, III-nitride depletion mode load 316h can supply high supply voltage $V_{SH}$ to output node 370 of inverter 354 and output node 358 of power-efficient pre-driver 300. When input node 356 is at, for example, zero volts, input transistor 218f is ON. Thus, shared node 372 is pulled to low supply voltage $V_{SL}$, thereby pulling gate voltage $V_{G4}$ to low supply voltage $V_{SL}$ and cutoff switch 324 is OFF. When cutoff switch 324 is OFF, III-nitride depletion mode load 316h is disconnected so as to prevent current from flowing from high supply voltage $V_{SH}$ of power-efficient pre-driver 300. More particularly, III-nitride depletion mode load 316h is disconnected from input transistor 318h so as to prevent current from flowing between high supply voltage $V_{SH}$ and low supply voltage $V_{SL}$.

Thus, as described above, cutoff switch 324 is driven by inverter 350. More particularly, cutoff switch 324 is driven by shared node 372, which comprises an output node of inverter 350. As such, cutoff switch 324 can be conveniently driven to provide a proper output voltage at output node 370. As cutoff switch 324 is driven by inverter 350, III-nitride depletion mode load 316f can easily be configured to supply sufficient current to drive a load coupled to output node 370 when cutoff switch 324 is ON.

Also, in some embodiments, inverter 354 can be configured to supply a much higher current from high supply voltage $V_{SL}$ than the other inverters in the gate driver. For example, power-efficient pre-driver 300 receives a high-side signal at input node 356 to generate an amplified signal at output node 358. Power can most effectively be conserved by including cutoff switch 324 in inverter 354, which can support the highest current in power-efficient pre-driver 300.

Figure 4:
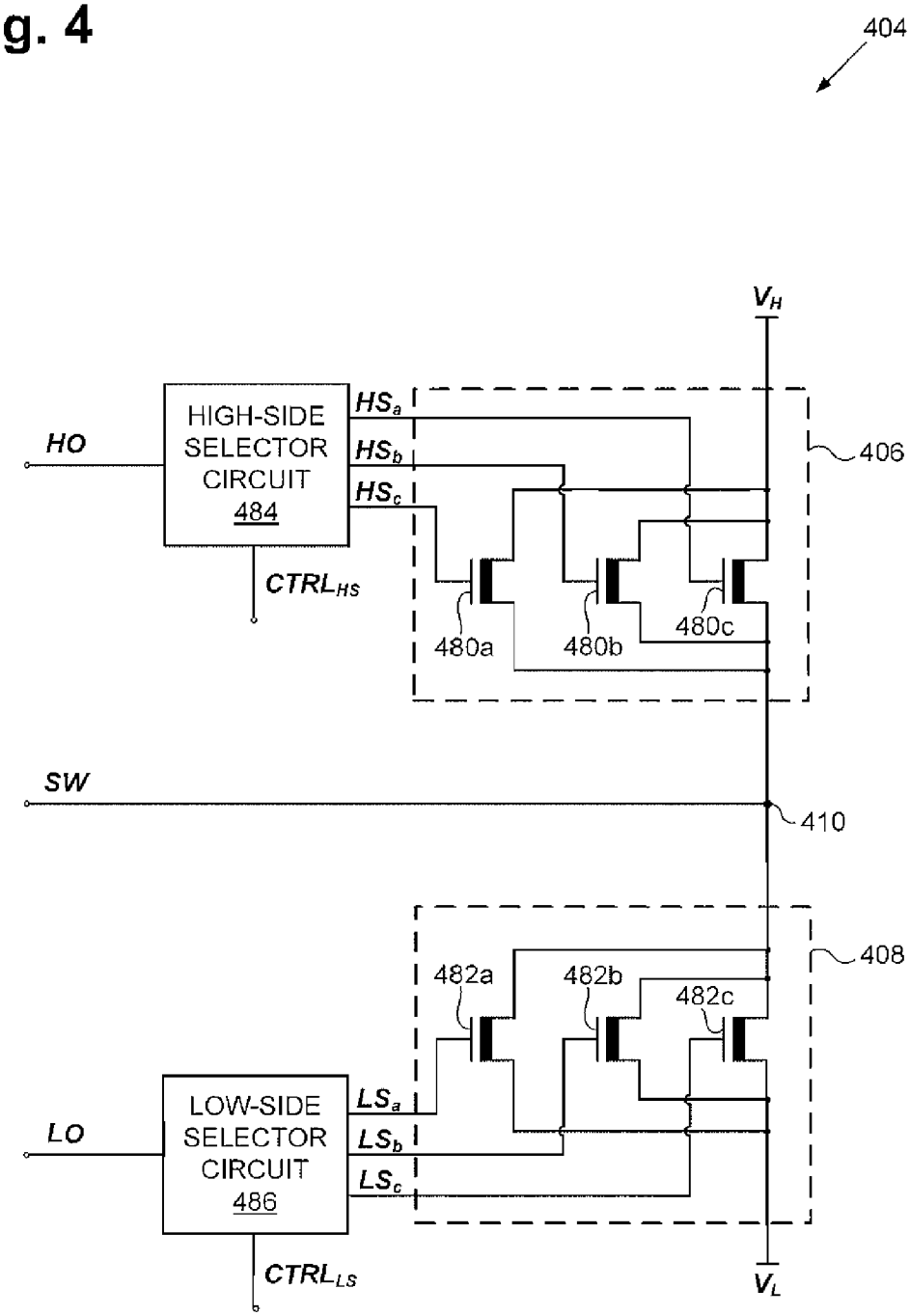
FIG. 4 shows an exemplary output stage, according to one embodiment of the invention.

Referring now to FIG. 4, FIG. 4 illustrates an exemplary output stage, according to one embodiment of the invention. FIG. 4 shows output stage 404, which can correspond to output stage 104 in FIG. 1. Output stage 404 includes high-side segmented III-nitride transistor 406, low-side segmented III-nitride transistor 408, and output node 410, which can correspond respectively to high-side output driver 106, low-side output driver 108, and output node 110 in FIG. 1. In the present embodiment, high-side segmented III-nitride transistor 406 comprises segments 480a, 480b, and 480c. Also in the present embodiment, low-side segmented III-nitride transistor 408 comprises segments 482a, 482b, and 482c.

Further shown in FIG. 4, output stage 404 includes high-side selector circuit 484 and low-side selector circuit 486. In the present embodiments, high-side selector circuit 484 is configured to selectively disable at least one segment of high-side segmented III-nitride transistor 406. For example, high-side selector circuit 484 is configured to selectively disable at least one of segments 480a, 480b, and 480c using at least one of respective high-side select signals $HS_a$, $HS_b$, and $HS_c$. In the present embodiment, high-side selector circuit 484 receives high-side select control signal $CTRL_{HS}$ to control which segments of segments 480a, 480b, and 480c are disabled using high-side select signals $HS_a$, $HS_b$, and $HS_c$.

Similarly, low-side selector circuit 486 is configured to selectively disable at least one segment of low-side segmented III-nitride transistor 408. For example, low-side selector circuit 486 is configured to selectively disable at least one of segments 482a, 482b, and 482c using at least one of respective low-side select signals $LS_a$, $LS_b$, and $LS_c$. In the present embodiment, low-side selector circuit 486 receives low-side select control signal $CTRL_{LS}$ to control which segments of segments 482a, 482b, and 482c are disabled using high-side select signals $LS_a$, $LS_b$, and $LS_c$.

In some embodiments, high-side and low-side selector circuits 484 and 486 can each comprise a multiplexer or a demultiplexer. It will be appreciated that high-side and low-side selector circuits 484 and 486 can be implemented using other means. By selectively disabling at least one segment of respective high-side and low-side segmented III-nitride transistors 406 and 408, high-side and low-side selector circuits 484 and 486 can reduce power consumption in output driver 404.

In some embodiments, at least one segment can be disabled based on a load connected to output node 410. For example, a relatively light load requires fewer respective segments of segmented III-nitride transistors 406 and 408 than a heavier load. In some embodiments, high-side and low-side selector circuits 484 and 486 can be configured to disable at least one segment of respective high-side and low-side segmented III-nitride transistors 406 and 408 prior to actual use of power conversion circuit 100 of FIG. 1.

In other embodiments, high-side and low-side selector circuits 484 and 486 are configured to selectively disable at least one segment of respective high-side and low-side segmented III-nitride transistors 406 and 408 dynamically during operation of power conversion circuit 100 of FIG. 1. Thus, in some embodiments high-side and low-side selector circuits 484 and 486 can be configured to selectively disable at least one segment of respective high-side and low-side segmented III-nitride transistors 406 and 408 to adapt to changing load conditions. For example, high-side selector circuit 484 can detect a lighter load and can selectively disable at least one segment of high-side segmented III-nitride transistor 406, or high-side selector circuit 484 can detect a heavier load and selectively enable at least one segment of high-side segmented III-nitride transistor 406.

FIG. 4 shows respective high-side and low-side segmented III-nitride transistors 406 and 408 having three segments for simplicity. However, any number of segments can be employed. Furthermore, it is noted that high-side select signals $HS_a$, $HS_b$, and $HS_c$, can each be configured to disable multiple segments of segmented III-nitride transistor 406. Similarly, low-side select signals $LS_a$, $LS_b$, and $LS_c$, can each be configured to disable multiple segments of segmented III-nitride transistor 406.

Thus, as discussed above, in the embodiments of FIGS. 1 through 4, the present invention can provide for a highly efficient III-nitride power conversion circuit. By including III-nitride transistors, the power conversion circuit can have high frequency switching capability and high current carrying capability. Furthermore, by providing for at least one of a plurality of cascaded inverters having a cutoff switch configured to disconnect a III-nitride depletion mode load, embodiments of the present invention can increase power efficiency by preventing current from flowing from a supply voltage of the at least one of the plurality of cascaded inverters. Also, power efficiency can be further increased by including an output driver comprising a segmented III-nitride transistor and a selector circuit configured to selectively disable at least one segment of the segmented III-nitride transistor.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A III-nitride power conversion circuit comprising:
a gate driver having a plurality of cascaded inverters, each of said plurality of cascaded inverters including at least one III-nitride transistor;
at least one of said plurality of cascaded inverters having a cutoff switch and a III-nitride depletion mode load, said cutoff switch configured to disconnect said III-nitride depletion mode load so as to prevent current from flowing from a supply voltage of said at least one of said plurality of cascaded inverters.

2. The III-nitride power conversion circuit of claim 1, wherein said cutoff switch of said at least one of said plurality of cascaded inverters is driven by one of said plurality of cascaded inverters.

3. The III-nitride power conversion circuit of claim 1, wherein an input transistor of said at least one of said plurality of cascaded inverters comprises a III-nitride enhancement mode transistor.

4. The III-nitride power conversion circuit of claim 1, wherein each of said plurality of cascaded inverters comprises a III-nitride depletion mode load.

5. The III-nitride power conversion circuit of claim 1, wherein said III-nitride depletion mode load is a GaN HEMT.

6. The III-nitride power conversion circuit of claim 1, wherein said cutoff switch is a III-nitride transistor.

7. The III-nitride power conversion circuit of claim 1, wherein said cutoff switch is an enhancement mode III-nitride transistor.

8. The III-nitride power conversion circuit of claim 1, wherein said gate driver is configured to drive a depletion mode output driver of said III-nitride power conversion circuit.

9. The III-nitride power conversion circuit of claim 1, wherein said III-nitride power conversion circuit is a buck converter.

10. The III-nitride power conversion circuit of claim 1 comprising an output driver driven by said gate driver, said output driver comprising a segmented III-nitride transistor;
a selector circuit configured to selectively disable at least one segment of said segmented III-nitride transistor.

11. The III-nitride power conversion circuit of claim 10, wherein said segmented III-nitride transistor is a depletion mode transistor.

12. A III-nitride power conversion circuit comprising:
a power-efficient pre-driver having a first inverter, a second inverter, and a third inverter, said third inverter comprising a III-nitride depletion mode load and a cutoff switch, said cutoff switch driven by said first inverter;
said cutoff switch configured to disconnect said III-nitride depletion mode load so as to prevent current from flowing from a supply voltage of said power-efficient pre-driver.

13. The III-nitride power conversion circuit of claim 12, wherein said third inverter is configured to supply a higher current from said supply voltage than said first inverter.

14. The III-nitride power conversion circuit of claim 12, wherein said third inverter comprises a III-nitride enhancement mode input transistor.

15. The III-nitride power conversion circuit of claim 12, wherein said first inverter and said second inverter each comprise a III-nitride depletion mode load.

16. The III-nitride power conversion circuit of claim 12, wherein said cutoff switch is an enhancement mode III-nitride transistor.

17. The III-nitride power conversion circuit of claim 12, wherein said first inverter, said second inverter, and said third inverter are in cascade.

18. The III-nitride power conversion circuit of claim 12, wherein said III-nitride power conversion circuit is a buck converter.

19. The III-nitride power conversion circuit of claim 12 comprising an output driver coupled to said power-efficient pre-driver, said output driver comprising a segmented III-nitride transistor;

a selector circuit configured to selectively disable at least one segment of said segmented III-nitride transistor.

20. The III-nitride power conversion circuit of claim 19 wherein said segmented III-nitride transistor is a depletion mode transistor.

\* \* \* \* \*